United States Patent [19]

Krupa, Jr.

[11] Patent Number: 4,710,706

[45] Date of Patent: Dec. 1, 1987

[54] ELECTRICAL MEASURING METER AND METHOD INCLUDING A CALIBRATING ELEMENT

[75] Inventor: Robert L. Krupa, Jr., Parma Heights, Ohio

[73] Assignee: Prime Instruments, Inc., Cleveland, Ohio

[21] Appl. No.: 764,800

[22] Filed: Aug. 9, 1985

[51] Int. Cl.⁴ .................... G01R 35/04; G01R 1/20
[52] U.S. Cl. .................................... 324/146; 324/74;
324/130; 324/151 R
[58] Field of Search ............... 324/146, 155, 151 R,
324/151 A, 130, 131, 74; 116/204

[56] References Cited

U.S. PATENT DOCUMENTS

| | | | |
|---|---|---|---|
| 526,487 | 9/1894 | Herberts | 324/147 |
| 2,697,204 | 12/1954 | Otzmann, Jr. | 324/151 |
| 2,826,739 | 3/1958 | Wouda | 324/151 |
| 2,836,796 | 5/1958 | Millar et al. | 324/151 |
| 2,867,768 | 1/1959 | Fribance et al. | 324/146 |
| 3,015,757 | 1/1962 | Van Campen | 317/166 |
| 3,275,936 | 9/1966 | Huston | 324/146 |
| 3,426,275 | 2/1969 | Schweitzer, Jr. | 324/127 |
| 3,671,861 | 6/1972 | Fleetman et al. | 324/146 |
| 3,713,024 | 1/1973 | Banus | 324/146 |
| 3,867,696 | 2/1975 | Raymond | 324/146 |
| 4,234,847 | 11/1980 | Schweitzer | 324/146 |
| 4,416,211 | 11/1983 | Hoffman | 324/74 X |

Primary Examiner—Reinhard J. Eisenzopf
Assistant Examiner—Jack B. Harvey
Attorney, Agent, or Firm—Renner, Otto, Boisselle & Lyon

[57] ABSTRACT

The electrical measuring meter comprises a polarized motor magnet mounted for movement to and from a starting position, a polarized holding magnet operative magnetically to influence the motor magnet constantly towards such starting position, and a calibrating element magnetized by the holding magnet to effect a partial cancellation of the holding magnet's influence on the motor magnet as is needed for calibration. The calibrating element preferably is in the form of a soft iron circular disc, and soft iron discs of different sizes are used to calibrate the meter for respective different maximum scale current values. Also, the high magnetic permeability of the soft iron disc enables the use of a rugged and economical sleeve bearing mount for the motor magnet even in a meter calibrated for low current measurement.

20 Claims, 4 Drawing Figures

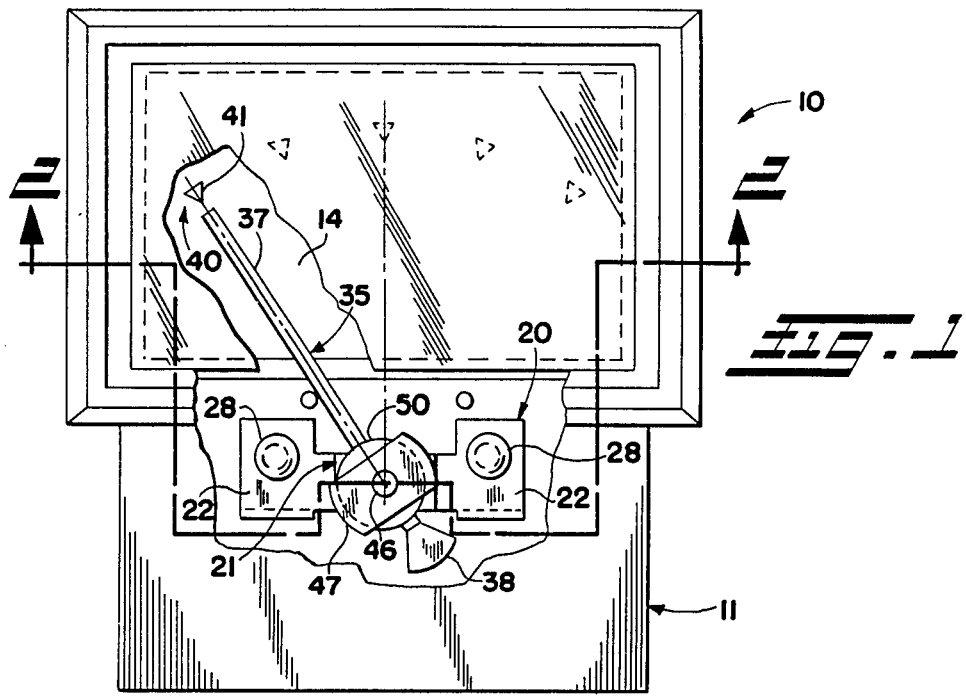
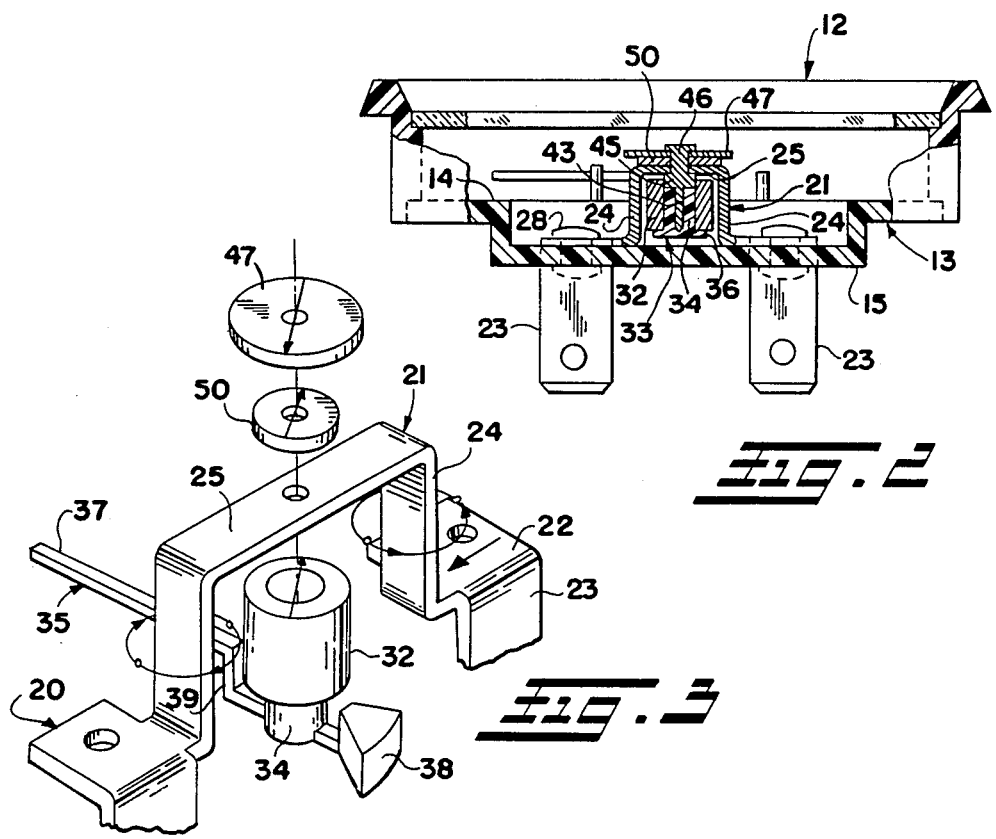

ELECTRICAL MEASURING METER AND METHOD INCLUDING A CALIBRATING ELEMENT

DISCLOSURE

The invention herein disclosed relates generally to an electrical measuring meter and, more particularly, to an economical, rugged, high sensitivity electrical current measuring meter which may be easily and accurately calibrated from 5 amperes full scale to over 100 amperes full scale.

BACKGROUND

Some prior art current measuring meters, i.e., ammeters, employ a pivoted polarized armature or motor magnet to which a pointer is connected. The motor magnet is mounted in operative relation to a current conducting bar and a polarized holding magnet is operatively disposed relative to the motor magnet to influence the motor magnet constantly toward a zero position. When current flows through the current bar, the current generated magnetic field reacts with the magnetic field of the motor magnet and causes the motor magnet to move from its zero position against the biasing or restoring force exerted by the holding magnet. Accordingly, the pointer will be caused to swing to indicate on an associated scale the magnitude of the current.

For an example of the foregoing type of current measuring meters, reference may be had to U.S. Pat. No. 2,867,768. As disclosed in this patent, a meter may be calibrated for various ranges by weakening or strengthening the holding magnet (varying the degree of magnetic saturation of the holding magnet) as by demagnetizing or remagnetizing the holding magnet. Accordingly, a meter may be calibrated for a high current range by fully saturating the holding magnet while an identically constructed meter may be calibrated for a lower current range by demagnetizing or remagnetizing the holding magnet to less than full saturation. Although this procedure is workable in theory, there are practical drawbacks including difficulty in precisely controlling the degree of partial saturation of the holding magnet in a manufacturing environment.

The above patent also illustrates two conventional types of mounting techniques for the motor magnet. According to one of these techniques, the motor magnet is mounted to a shaft which is journalled between two axially spaced bearings. This spaced bearing type of mount, however, makes meter fabrication and assembly relatively difficult and costly. Respecting the other mounting technique, the motor magnet is mounted on a concentric sleeve bearing having a central hole shaped at its bottom to form a jewel. The sleeve bearing is slipped over a bearing axle and the magnetic attraction between the motor magnet and holding magnet holds the sleeve bearing such that the jewel thereof effects point bearing contact with a pointed end of the axle.

The spaced bearing type of mount has been used successfully in both high current and low current measuring meters, i.e., those calibrated for high full scale current values and low full scale current values, respectively. On the other hand, the sleeve bearing mount has found practical application in only high current measuring meters, i.e., meters calibrated for full scale current values of 30 amps or more. Prior attempts to use a sleeve bearing mount in low current measuring meters have resulted in inadequate meter performance. Generally, the sleeve bearing mount cannot provide as low a frictional resistance to turning of the motor magnet as can be achieved by a spaced bearing mount. Accordingly, a higher torque is required to overcome such frictional resistance and this presents a major problem when measuring small currents. Still another problem is that when the holding magnet is calibrated for low current measurement by weakening its magnetic field intensity, the magnetic attraction between the holding magnet and motor magnet generally is insufficient to hold the sleeve bearing in proper axial position on the bearing axle with the result being higher frictional resistance to turning of the motor magnet. Accordingly, it heretofore has been necessary to use the more difficult and expensive spaced bearing type of mount in low current measuring meters.

SUMMARY OF THE INVENTION

The present invention overcomes the above noted problems encountered in prior attempts to use a sleeve bearing mount in a low current measuring meter with the result being a rugged, economical, high sensitivity meter. The present invention also provides for easy and precise calibration of the meter.

Briefly, an electrical measuring meter according to the invention is characterized by a polarized motor magnet mounted for movement to and from a starting position, a polarized holding magnet operative magnetically to influence the motor magnet constantly toward the starting position, and calibrating means magnetized by the holding magnet to effect a partial cancellation of the holding magnet's influence on the motor magnet as is needed for calibration.

More particularly, an electric measuring meter according to the invention comprises a polarized motor magnet mounted for movement to and from a starting position, a polarized holding magnet operative to bias the motor magnet to such starting position by reaction of the magnetic field of the holding magnet with the magnetic field of the motor magnet, means for positioning a current conducting member in operative relation to the motor magnet such that the magnetic field caused by current flowing through the current conducting member will react with the magnetic field of the motor magnet to develop a motor action moving the motor magnet away from its starting position, and a calibrating element operatively positioned in the magnetic field of the holding magnet to reduce the strength of the magnetic field of the holding magnet which reaches and reacts with the magnetic field of the motor magnet. The calibrating element preferably is in the form of a circular disc of soft iron which is disposed between the holding magnet and motor magnet. The soft iron disc is magnetized by the holding magnet and this operates to partially cancel intensity of the holding magnet's magnetic field which reaches and reacts with the magnetic field of the motor magnet, i.e., reduce the effective magnetism of the holding magnet as is needed for calibration. The magnitude of such cancellation is a function of the size of the disc whereby otherwise identical meters preferably including identical fully saturated holding magnets may be calibrated for different full scale current values simply by using respective differently sized soft iron discs. Also, closely held dimensions of the soft iron discs serve to provide precise and uniform calibration from meter to meter. As will be appreciated, it is much easier to control the dimensions of the discs to effect accurate calibration than it is to effect calibration with equivalent accuracy by the prior art practice of varying the degree of saturation of the holding magnet.

The invention is further characterized by the preferred usage of a rugged, economical and simple sleeve bearing mount for the motor magnet in a meter having high sensitivity for measuring low currents. According to this aspect of the invention, the soft iron disc of high magnetic permeability serves to increase meter sensitivity by increasing the effect of the current generated magnetism driving the motor magnet with the result being higher torque sufficient to overcome the higher torque required by the sleeve bearing mount in meters ranging, in particular, from as low as 5 amperes full scale to over 100 amperes full scale. When current flows through the current conducting member, the magnetic flux of the latter magnetizes the soft iron disc. The magnetic flux of the magnetized soft iron disc combines with the current conducting member's magnetic flux in the region of the motor magnet to increase the torque exerted on the motor magnet. Also, the motor magnet will always be attracted to the soft iron disc to maintain proper sleeve bearing point contact.

The foregoing and other features of the invention are hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

In the annexed drawings:

FIG. 1 is a front elevational view, partly broken away, of an electrical measuring meter according to the invention;

FIG. 2 is a transverse section through the meter of FIG. 1 taken substantially along the line 2—2 thereof;

FIG. 3 is an exploded schemantisized illustration of the working components of the meter of FIG. 1.

DETAILED DESCRIPTION

Figure 4:
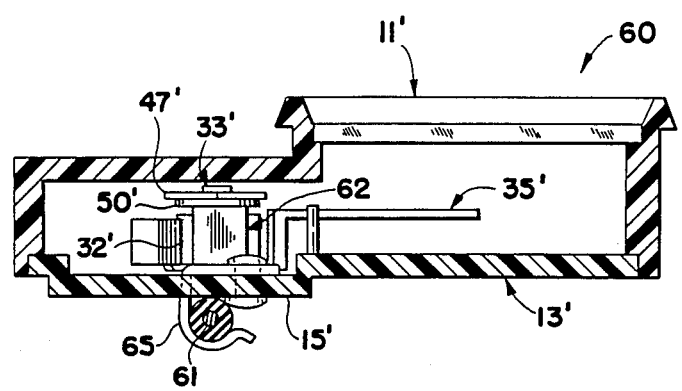
FIG. 4 is a section through another meter embodiment which is structurally similar to the meter shown in FIG. 1.

Referring now in detail to the drawings and initially to FIGS. 1 and 2, an electrical measuring meter according to the invention is indicated generally at 10. The meter 10, which more popularly would be referred to as an ammeter, includes a case 11 consisting a front cover 12 and a back plate 13. The back plate 13 has an upper planar portion 14 and a lower portion including a rearwardly recessed wall 15 parallel to the plane of the upper portion 14. The front cover 12 and back plate 13 preferably are made of an electrically nonconductive material of low magnetic permeability such as a plastic or plastic-like material.

At the recessed wall 15, there is provided a current carrying member in the form of a current conducting bar 20. The current bar 20, going from the middle to each end thereof, has a central U-shape portion 21, a respective lug portion 22 and a respective connecting tab portion 23. The central U-shaped portion 21 is formed by parallel legs 24 and a bridge 25 connecting the legs. Each lug portion or lug 22 extends perpendicularly from the distal end of the respective legs 24 and each tab portion or tab 23 extends rearwardly and perpendicularly from an edge of the respective lug. The current bar may be made of any suitable electrically conductive material having low magnetic permeability such as copper.

The coplanar lugs 22 of the current bar 20 are attached flat against the recessed wall 15 by respective rivets 28. The tabs 23, which pass through respective slot-like openings in the recessed wall, project rearwardly beyond the recessed wall to provide for connection of the current bar in a circuit whose current is to be measured by the meter. The tabs may have a thickness of about 0.032 inch and a width of about 0.250 inch which is typical of the connecting tabs or prongs found in conventional meters.

The U-shape portion 21 of the current bar 20 is sized to accommodate within the bight thereof a permanent bipolar magnet 32 herein referred to as the armature or motor magnet. The motor magnet 32 is of generally cylindrical shape and is mounted to the bridge 25 of the current bar by a sleeve bearing mount 33 for pivotal movement about its axis which is parallel to the legs 24 and perpendicular to the bridge 25 of the current bar. The sleeve bearing mount 33 includes a cylindrical sleeve bearing 34 which is concentrically fitted in an axial centerbore of the motor magnet 32. As is preferred, the sleeve bearing 34 is integrally formed at its lower end with a pointer 35 which has a base portion 36 overlapping the bottom end of the motor magnet, an indicating portion 37 extending radially from the axis of the motor magnet, and a counterweight portion 38 extending radially opposite the indicating portion for locating the center of gravity of the pointer at the axis of the motor magnet. As seen in the schematic exploded illustration of FIG. 3, the indicating arm 37 is formed with an offset 39 such that the pointer end of such arm extends over and parallel to the front face of the back plate's upper portion 14 in spaced relationship. As seen in FIG. 1, such front face may have applied thereto a scale 40 for indicating the magnitude of needle deflection from a zero position, such as that indicated at 41. As will be appreciated from the following description, the deflection of the pointer 35 from the zero or starting position 41 will be indicative of the magnitude of current flowing through the current bar 20. The sleeve bearing 34 and pointer 35 preferably are molded from plastic or plastic-like material as a single piece.

The sleeve bearing 34 has a concentrically located, upwardly opening hole at which the sleeve bearing may be axially slipped over the pivot pin or axle 43 of a bearing support member 44. The axle 43 depends from a diametrically enlarged shoulder portion 45 of the bearing support member which engages the bottom surface of the current bar bridge 25 and a small diameter rivet end portion 46 which passes through a hole in the bridge 25 for projecting above the bridge. Concentrically supported on the projecting rivet end portion 46 is a permanent bipolar magnet 47 herein referred to as the holding magnet. As best seen in FIG. 2, the distal end of the rivet end portion is peened or swaged over the top surface of the holding magnet to secure the holding magnet and bearing support member to the bridge 25 of the current bar 20.

Assuming sufficient magnetic attraction between the motor magnet 32 and the holding magnet 47, the sleeve bearing 34 will be pulled upwardly with the bottom of the sleeve bearing hole engaging the pointed bottom end of the axle 43. The bottom of the sleeve bearing hole is formed with a jewel having a cone angle larger than the cone angle of the pointed end of the axle for effecting point bearing contact. As is apparent from FIG. 2, the sleeve bearing, motor magnet and pointer 35, which also may be referred to as an armature assembly, is precluded from falling off the axle by the recessed wall 15.

The magnetic field of the holding magnet 47 reacts with the magnetic field of the motor magnet 32 to provide a starting point adjustment for the pointer 35 so that it indicates, for example, a zero reading on the meter scale 40 when no current is flowing through the current bar 20. The holding magnet also serves to provide a restoring or biasing force acting on the motor magnet against the motor force which acts on the motor magnet when current flows through the current bar. That is, current flowing through the current bar produces a magnetic field which reacts with the magnetic field of the motor magnet to effect a motor action rotating the motor magnet away from its starting position, i.e., clockwise in FIG. 1. Such movement will be forcibly opposed by the force exerted by the holding magnet on the motor magnet which tries to restore the motor magnet to its starting position. This opposing or restoring force increases as a function of motor magnet movement relative to the holding magnet whereby the amount of motor magnet rotation will be a function of the magnitude of the current flowing through the current bar.

During assembly of the meter, the holding magnet 47 may be set to zero the pointer 35 relative to the meter scale 40 by rotating the holding magnet relative to the axis of the motor magnet 32. Once set, the rivet end 46 of the bearing support member 44 may be peened or swaged to fixedly hold the holding magnet in such set position.

As thus far described, the meter 10 is similar in construction to a prior art meter wherein calibration was effected by weakening or strengthening the holding magnet. That is, the holding magnet would be demagnetized or remagnetized to provide the requisite magnetic flux density for a particular full scale current value. Theoretically, the meter could be calibrated for low full scale current values, but meter performance and reliability was found to be inadequate because of the above discussed problems associated with the sleeve bearing mount for the motor magnet.

In accordance with the present invention, calibration of the meter 10 is accomplished by positioning a calibrating element 50 of selected dimensions between the holding magnet 47 and motor magnet 32 to effect a reduction in the strength or intensity of the holding magnet's magnetic field which reaches and reacts with the magnetic field of the motor magnet to provide the aforesaid biasing or restoring force. As will be realized, the restoring force, which will be correspondingly reduced as is needed for calibration, is a function of the calibrating element's magnetic permeability and dimensional size. As is preferred, the calibrating element is made of a magnetically soft material having high magnetic permeability, most preferably soft iron such as AISI M22 Dynamo Magnet Steel, and calibrating elements of different sizes are used to calibrate the meter for different full (maximum) scale current values without otherwise modifying the meter.

In the illustrated embodiment, the calibrating element 50 is a soft iron disc which, as shown, may be concentrically mounted on the rivet end 46 of the bearing support member 44 between the holding magnet 47 and the bridge 25 of the current bar 20. The soft iron disc 50, being in direct magnetic contact with the holding magnet, is magnetized by the holding magnet. This results in a subtracting of magnetic intensity from the holding magnet vis-a-vis the motor magnet 32 and thus a partial cancellation of the holding magnet's magnetic field intensity in the region of the motor magnet. The soft iron disc essentially acts as a magnetic shunt interposed between the holding magnet and motor magnet to reduce the effective magnetism (gauss) of the holding magnet.

Importantly, the amount of magnetic intensity subtracted or cancelled, i.e., the reduction in the holding magnet's effective magnetism, is a function of the size of the soft iron disc 50. More magnetic intensity will be cancelled as the size of the soft iron disc is increased. The soft iron disc preferably is a circular planar disc whereby discs of different thicknesses and/or diameters may be used to calibrate the meter for respective different maximum scale current values.

By using soft iron discs 50 of different sizes to effect meter calibration, both the holding magnet 47 and mator magnet 32 may be saturated permanent magnets as is preferred. This permits more accurate presetting of the intensities of such magnets and hence facilitates accurate meter calibration. Also, the dimensions of the soft iron discs can be relatively easily held within close tolerances to hold calibration from meter to meter, particularly in relation to the prior practice of calibrating meters by controlling the amount of holding magnet magnetism by demagnetizing or remagnetizing the holding magnet.

The foregoing means by which the meter 10 is calibrated greatly facilitates the manufacture of meters calibrated for different maximum scale current values as well as the same maximum scale current value. As is preferred, the soft iron discs may be of like thickness from meter to meter with meter calibration being controlled by the diameter of the soft iron disc. It has been found that a linear relationship exists between the soft iron disc diameter and the current needed to effect full scale deflection of the motor magnet. Accordingly, the only changes that need be made in the manufacturing process to produce a meter with a different full scale current value are the substitution of the required diameter soft iron disc and the appropriate scale.

The use of calibrating elements 50 made of material having high magnetic permeability also gives several other advantages. Because of the high magnetic permeability of the soft iron disc, the magnetic flux caused by current flowing through the current bar 20 will magnetize the soft iron disc and this will increase the effective magnetism driving the motor magnet 32 and hence the sensitivity of the meter. This increase in effective magnetism and sensitivity gives rise to a higher torque sufficient to overcome the high torque required by the simpler and more rugged sleeve bearing mount 33 for the motor magnet thereby enabling such sleeve bearing mount to be used in meters calibrated for full scale current values less than 30 amperes and as low as 5 amperes. Also, the motor magnet will always be attracted to the soft iron disc with sufficient force to maintain proper sleeve bearing point contact. Moreover, the increased sensitivity and sleeve bearing holding force are advantageously a function of the size of the soft iron disc which, as above indicated, is increased to decrease the full scale current value of the meter.

That is, the increase in size of the soft iron disc needed to decrease the full scale current value of the meter affords a proportionately greater increase in sensitivity and sleeve bearing holding force as is needed to enable usage of the sleeve bearing mount in meters calibrated for low current measurement with adequate sensitivity.

As above indicated, the meter 10 is adapted to be electrically connected in a circuit for measurement of current flowing through such circuit. That is, the meter is connected in the circuit such that the current to be measured flows through the current bar 20.

In FIG. 4, another embodiment of a meter according to the invention is indicated generally at 60. The meter 60 provides for measurement of current through an electrical conductor such as the insulated wire indicated at 61 without being electrically connected in series with such wire. Except as noted below, the meter 60 is identical to the meter 10 and, in FIG. 4, primed reference numerals are used to designate elements corresponding generally to those identified above by the same unprimed reference numerals.

As seen in FIG. 4, the meter comprises a case 11', motor magnet 32', holding magnet 47', sleeve bearing mount 33', and a calibrating element 50' which all may be identical to the above described corresponding elements both in structure and function. Unlike the meter 10, the meter 60 includes a mounting bracket 62 similar in shape to the current conducting bar 20 of the meter 10 but which does not serve as a current conducting member. However, like the current conducting bar 20, the mounting bracket 62 preferably is made of a material having low magnetic permeability whereby it has little influence on the magnetic circuit components of the meter 60.

As seen at 65, the tab portions of the mounting bracket 62, which project through and beyond the recessed wall 15' of the back plate 13', are bent to form clip-like members which serve to positionally locate the meter 60 in relation to the wire 61 as by clip-on attachment of the meter to the wire, or vice versa. More particularly, the clip-like tabs 65, cooperatively with the back plate 13', serve to relatively position the wire and meter such that the portion of the wire extending between the tabs generally extends normal to and intersects the pivot axis of the motor magnet 32'. In the illustrated embodiment, the held portion of the wire generally extends parallel to the mounting bracket 62 to which the magnetic axis of the holding magnet 47' may be adjustably angularly positioned for zeroing of the pointer 35' in a manner similar to that above described.

In operation, the magnetic field generated by current flowing through the wire 61 reacts with the magnetic field of the motor magnet 32' to effect a motor action which causes the motor magnet to rotate against the restoring force exerted by the holding magnet 47' which is controllably reduced by the soft iron disc 50'. Except for this difference, the meter functionally operates in the same manner as the meter 10. Also, calibration of the meter 60 is effected in essentially the same manner as meter 10 is calibrated by the use of the soft iron disc 50'.

Although the invention has been shown and described with respect to preferred embodiments, it is obvious that equivalent alterations and modifications will occur to others skilled in the art upon the reading and understanding of the specification. The present invention includes all such equivalent alterations and modifications, and is limited only by the scope of the following claims.

What is claimed is:

1. In an electrical measuring meter, a polarized motor magnet mounted for movement to and from a starting position, a permanent, polarized holding magnet operative magnetically to influence said motor magnet towards such starting position, and calibrating means magnetized by said holding magnet and positioned between said holding magnet and motor magnet to effect a partial cancellation of the holding magnet's influence on said motor magnet.

2. A meter as set forth in claim 1, wherein said calibrating means is made of magnetically soft material.

3. A meter as set forth in claim 2, wherein said magnetically soft material is a ferromagnetic material having high magnetic permeability.

4. A meter as set forth in claim 1, wherein said motor magnet is pivoted, and said calibrating means is a soft iron disc mounted concentrically with the pivot axis of said motor magnet and axially between said motor magnet and said holding magnet.

5. A meter as set forth in claim 1, further comprising a sleeve bearing mount for said motor magnet so disposed that magnetic attraction between said motor magnet and calibrating means combines with magnetic attraction between said motor and holding magnet to maintain proper sleeve bearing point contact.

6. A meter as set forth in claim 1, further comprising a current conducting member disposed in operative relation to said motor magnet such that magnetic flux produced by current flowing through said current conducting member reacts with the magnetic field of said motor magnet to develop a motor action moving said motor magnet away from its starting position.

7. A meter as set forth in claim 6, wherein said current conducting member includes a strap made of electrically conductive material, said strap having parallel portions on opposite sides of said motor magnet and a bridging portion extending over said motor magnet and connecting said parallel portions, and means for mounting said holding magnet and calibrating means to said bridging portion in axial alignment with a pivot axis of said motor magnet.

8. A meter as set forth in claim 1, wherein said holding magnet is saturated.

9. A meter as set forth in claim 8, wherein said motor magnet is saturated.

10. A meter as set forth in claim 1, including mounting means for fixing the position of said calibrating means between said holding magnet and motor magnet.

11. A meter as set forth in claim 6, further comprising a sleeve bearing mount for said motor magnet so disposed that magnetic attraction between said motor magnet and calibrating means combines with magnetic attraction between said motor and holding magnet to maintain proper sleeve bearing point contact, and wherein said current conducting member includes a strap made of electrically conductive material, said strap having parallel portions on opposite sides of said motor magnet and a bridging portion extending over said motor magnet and connecting said parallel portions.

12. A meter as set forth in claim 11, wherein said sleeve bearing mount includes a sleeve bearing and a pivot pin, said pivot pin having a pointed end in point contact with said sleeve bearing and a mounting end attached to said bridging portion.

13. A meter as set forth in claim 12, wherein said mounting end of said pivot pin passes through and projects beyond said bridging portion of said current conducting member to provide a projecting end portion, and said holding magnet and calibrating means are engaged and located by said projecting end portion.

14. A meter as set forth in claim 12, wherein said holding magnet and motor magnet are both saturated.

15. An electrical measuring meter comprising a polarized motor magnet mounted for movement to and from a starting position, a permanent, polarized holding magnet operative to bias said motor magnet to said starting position by reaction of its magnetic field with the magnetic field of said motor magnet, means for positioning a current conducting member in operative relation to said motor magnet such that the magnetic flux produced by current flowing through the current conducting member will react with the magnetic field of said motor magnet to develop a motor action moving said motor magnet away from is starting position, and calibrating body means magnetized by said holding magnet and operatively positioned between said holding magnet and motor magnet to reduce by a predetermined amount the strength of such field reaching and reacting with the magnetic field of said motor magnet.

16. An electrical meter comprising a polarized motor magnet, a sleeve bearing mount for said motor magnet, a permanent holding magnet operative to influence said motor magnet constantly towards a starting position, and magnetically soft means disposed between said holding magnet and motor magnet along the pivot axis of said motor magnet and magnetized by said motor magnet for effecting a magnetic attraction therebetween which operates to maintain proper point bearing contact of said sleeve bearing mount.

17. A method of calibrating electrical measuring meters of the type including a motor magnet and a holding magnet operative to influence the motor magnet to a starting position, comprising the steps of operatively positioning in first meters essentially identical, unadjustable first calibrating elements of magnetically soft material between the holding magnet and motor magnet to effect essentially identical partial cancellation of the holding magnet's influence on the motor magnet, and operatively positioning in second meters essentially identical, unadjustable second calibrating elements of magnetically soft material between the holding magnet and motor magnet to effect an essentially identical partial cancellation of the holding magnet's influence on the motor magnet, said second calibrating elements being different from said first calibrating elements for effecting a different degree of partial cancellation to calibrate the second meters for a different maximum scale value that the first meters.

18. A method as set forth in claim 17, wherein calibrating elements of different dimensions are used to calibrate the meter for respective different maximum scale current values.

19. A method as set forth in claim 18, wherein the calibrating elements are circular discs of magnetically soft material.

20. A method as set forth in claim 19, wherein calibrating discs of like thickness but different diameters are used to effect calibration of the meters for respective different maximum scale current values.

* * * * *